United States Patent
Nawata (10) Patent No.: US 8,659,951 B2
(45) Date of Patent: Feb. 25, 2014

(54) NONVOLATILE SEMICONDUCTOR MEMORY DEVICE AND METHOD OF DATA WRITE THEREIN

(75) Inventor: Hidefumi Nawata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 13/423,708

(22) Filed: Mar. 19, 2012

(65) Prior Publication Data

US 2013/0088924 A1   Apr. 11, 2013

(30) Foreign Application Priority Data

Oct. 7, 2011   (JP) ............................... P2011-223009

(51) Int. Cl.
*G11C 11/34*   (2006.01)

(52) U.S. Cl.
USPC ............ 365/185.22; 365/185.17; 365/185.24; 365/184

(58) Field of Classification Search
USPC ................. 365/185.22, 185.17, 185.24, 184
See application file for complete search history.

(56) References Cited

U.S. PATENT DOCUMENTS 7,616,502 B2   11/2009   Iwai
7,796,438 B2 *   9/2010   Kim et al. ................ 365/185.22

FOREIGN PATENT DOCUMENTS

JP    2008-269736       11/2008
WO   WO 2008/063972 A2   5/2008

* cited by examiner

*Primary Examiner* — Jason Lappas
(74) *Attorney, Agent, or Firm* — Oblon, Spivak, McClelland, Maier & Neustadt, L.L.P.

(57) ABSTRACT

A bit line is electrically connected to one end of a current path of a memory cell. A word line is commonly connected to the memory cells arranged in a direction intersecting the bit line. A control circuit executes a write operation for applying a write voltage to the word line so shift a threshold voltage of the memory cell to be data written that the threshold voltage of the memory cell to be data written reaches a certain threshold voltage. During the write operation, the control circuit, while applying a gradually rising write voltage to the word line, gradually changes a voltage applied to the bit line based on a relationship between the threshold voltage of the memory cell to be written and a number of times of the write voltage applications.

20 Claims, 9 Drawing Sheets

NONVOLATILE SEMICONDUCTOR MEMORY DEVICE AND METHOD OF DATA WRITE THEREIN

CROSS-REFERENCE TO RELATED APPLICATIONS

This application is based upon and claims the benefit of priority from the prior Japanese Patent Application No. 2011-223009, filed on Oct. 7, 2011, the entire contents of which are incorporated herein by reference.

FIELD

The embodiments relate to an electrically rewritable nonvolatile semiconductor memory device and a method of data write therein.

BACKGROUND

Demand for NAND type flash memory is increasing rapidly along with the increase in applications handling large volumes of data such as photographic images and moving images in mobile appliances, and the like. In particular, the adoption of multilevel storage technology enabling two bits or more of information to be stored in one memory cell makes it possible to store a greater amount of information in a small chip area.

As number of levels in the multilevel storage technology increases, the margin between threshold voltage distributions in memory cells narrows, hence it becomes necessary to control each of the threshold voltage distributions more narrowly. One technique for achieving this is a method where write voltages are applied to the memory cells by dividing the write voltages into a plurality of pulses having pulse heights that increase stepwise. Also known is a high-speed pass write system and so on, where two stages of write verify reads are performed during data write. However, with increasing miniaturization, there is a problem that, even if these systems are adopted, effects of program noise due to write voltage application cause variation in the amount of threshold shift in memory cells, whereby threshold voltage distributions become larger.

DETAILED DESCRIPTION

A nonvolatile semiconductor memory device according to an embodiment includes a memory cell, a bit line, a word line, and a control circuit. The memory cell is configured electrically data rewritable. The bit line is electrically connected to one end of a current path of the memory cell. The word line is commonly connected to the memory cells arranged in a direction intersecting the bit line. The control circuit executes a write operation for applying a write voltage to the word line so shift a threshold voltage of the memory cell to be data written that the threshold voltage of the memory cell to be data written reaches a certain threshold voltage. During the write operation, the control circuit, while applying a gradually rising write voltage to the word line, gradually changes a voltage applied to the bit line based on a relationship between the threshold voltage of the memory cell to be written and a number of times of the write voltage applications.

Next, a nonvolatile semiconductor memory device according to an embodiment is described with reference to the drawings.

[Configuration]

Figure 1:
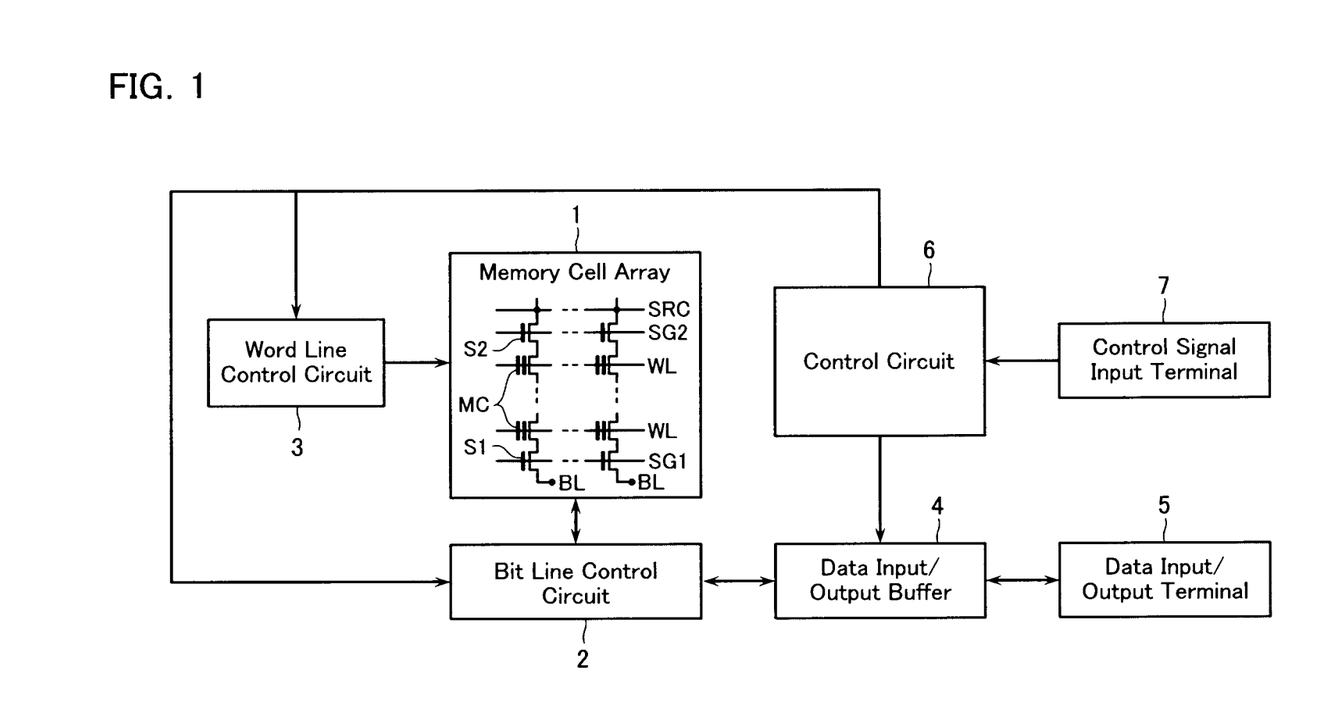
FIG. 1 is a block diagram showing a schematic configuration of a nonvolatile semiconductor memory device (NAND cell type flash memory) according to an embodiment.

FIG. 1 shows a configuration of a nonvolatile semiconductor memory device (two-level or multilevel write system NAND cell type flash memory) adopting a two-level storage system according to an embodiment. This nonvolatile semiconductor memory device comprises a memory cell array 1 having data-storing memory cells MC arranged in a matrix. The memory cell array 1 includes a plurality of bit lines BL, a plurality of word lines WL, a source line SRC, and a plurality of the memory cells MC. The memory cells MC are configured electrically data rewritable and disposed in a matrix at intersections of the bit lines BL and word lines WL.

Connected to the memory cell array 1 are a bit line control circuit 2 for controlling a voltage of the bit line BL and a word line control circuit 3 for controlling a voltage of the word line WL. The bit line control circuit 2 selects a bit line BL based on a column address, and reads data of the memory cell MC in the memory cell array 1 via the selected bit line BL. At the same time, the bit line control circuit 2 transfers data to be written to a memory cell MC in the memory cell array 1 to a selected bit line BL. The word line control circuit 3 selects a word line WL connected to a memory cell to be accessed based on a row address and applies various kinds of voltages, such as a write voltage, a read voltage, a write pass voltage, and so on, to the word line WL.

Connected to the bit line control circuit 2 is a data input/output buffer 4. Data of the memory cell MC read from the memory cell array 1 is outputted to external from a data input/output terminal 5 via the data input/output buffer 4. In addition, write data inputted to the data input/output terminal 5 from external is inputted to the bit line control circuit 2 via the data input/output buffer 4 to be written to a designated memory cell MC.

The memory cell array 1, the bit line control circuit 2, the word line control circuit 3 and the data input/output buffer 4 are connected to a control circuit 6. The control circuit 6 generates control signals for controlling the bit line control circuit 2, the word line control circuit 3 and the data input/output buffer 4 in accordance with a control signal inputted from a control signal input terminal 7.

Figure 2:
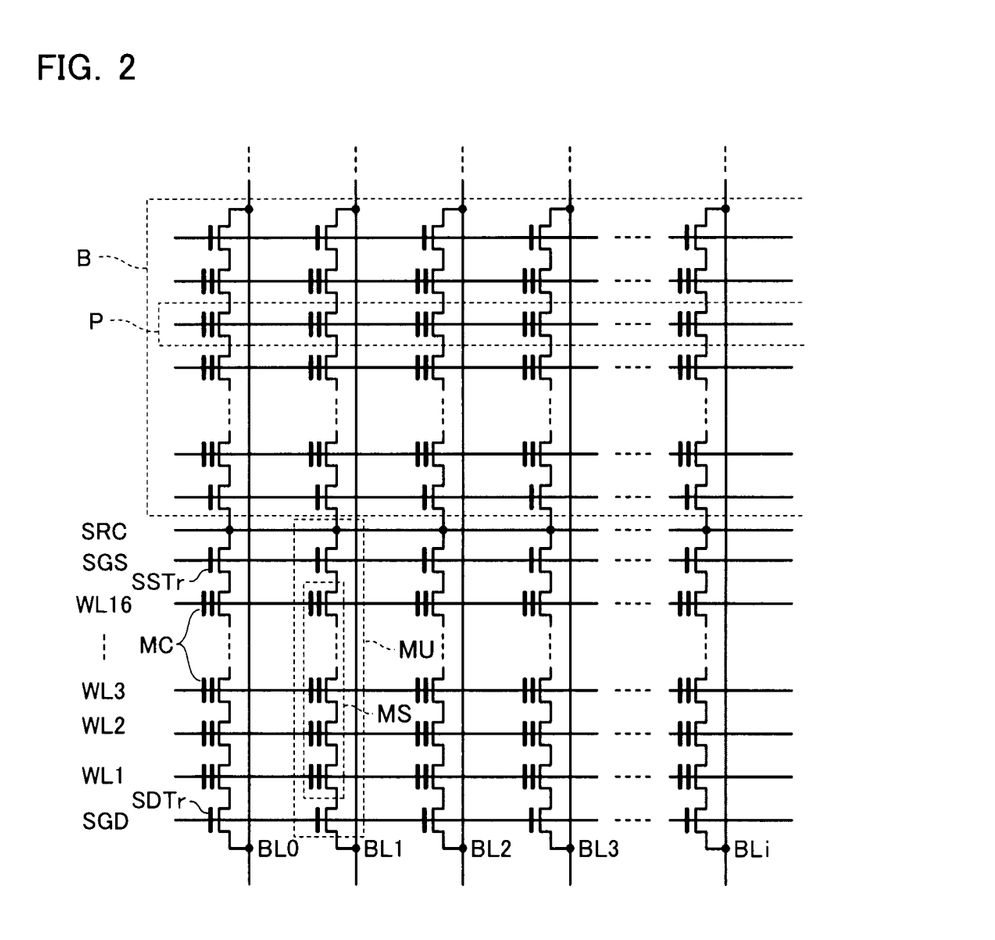
FIG. 2 is a circuit diagram showing a configuration of a memory cell array 1 shown in FIG. 1.

FIG. 2 shows a configuration of the memory cell array 1 shown in FIG. 1. As shown in FIG. 2, the memory cell array 1 is configured in a plurality of blocks B. In the memory cell array 1, data is erased in a unit of this block B (block erase processing).

As shown in FIG. 2, the block B includes a plurality of memory units MU. One memory unit MU is configured by a memory string MS comprising, for example, 16 memory cells MC(EEPROM) connected in series, and by a drain side select transistor SDTr and a source side select transistor SSTr connected to the two ends of the memory string MS. One end of the drain side select transistor SDTr is connected to the bit line BLi, and one end of the source side select transistor SSTr is connected to the source line SRC. Control gates of the memory cells MC disposed in a line in a row direction are commonly connected to one of the word lines WL1-WL16. In addition, control gates of the drain side select transistors SDTr disposed in a line in the row direction are commonly connected to a drain side select gate line SGD, and control gates of the source side select transistors SSTr disposed in a line in the row direction are commonly connected to a source side select gate line SGS.

Moreover, a group P of a plurality of memory cells MC connected to one word line WL configures one page. Data is written and read in units of this group P.

[Write Operation]

Figure 3:
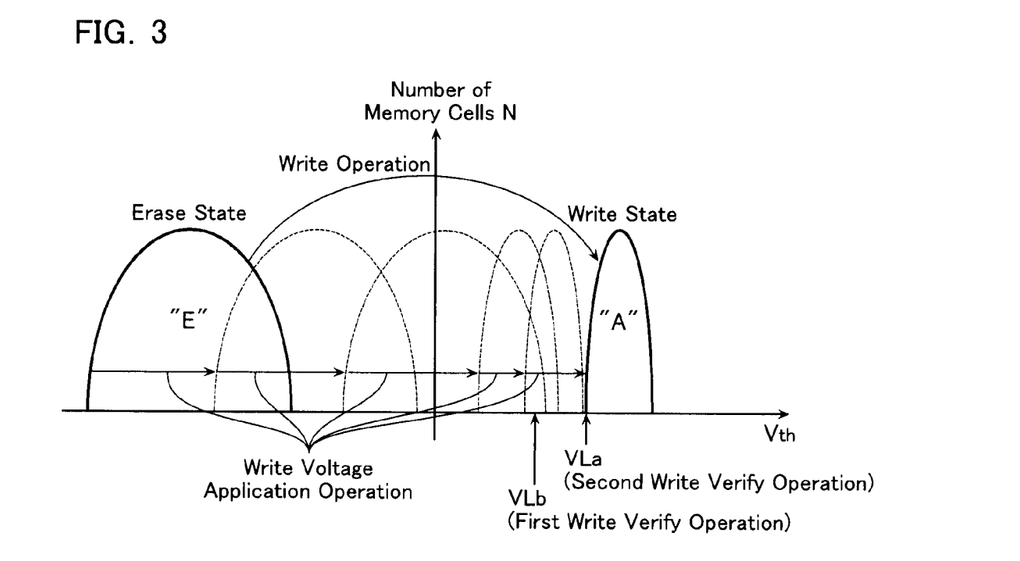
FIG. 3 is a view showing a write operation in a two-level storage flash memory according to the embodiment.

Next, a write operation of the nonvolatile semiconductor memory device is described. FIG. 3 shows a relationship between the write operation of the memory cells MC and a threshold voltage distribution of the memory cells MC.

As shown in FIG. 3, in the case of two-level data storage, the threshold voltage distribution of the memory cells MC includes one negative distribution E (data "1") indicating an erase state and one positive distribution A indicating a write state (data "0"). Moreover, in the case of four-level data storage, the threshold voltage distribution of the memory cell MC includes one negative distribution E (data "11") indicating an erase state and three positive distributions A, B and C indicating write states (data "00", "01" and "10"; however, B and C are not shown).

As shown in FIG. 3, the write operation according to the present embodiment shifts the threshold voltage distribution E in a positive direction to set the threshold voltage distribution A. That is, the write operation sets a threshold voltage Vth of the memory cell MC to be equal to or more than a verify voltage VLa of a lower end of the threshold voltage distribution A. The write operation repeatedly executes a write voltage application operation, a first write verify operation and a second write verify operation.

The write voltage application operation applies a write voltage Vpgm to the gate of the memory cell MC to shift the threshold voltage Vth of the memory cell MC in a positive direction. The write voltage Vpgm is formed by a plurality of pulse voltages that are stepped up by an amount of ΔVpgm such that their pulse heights gradually increase. The first write verify operation is performed after the write voltage application operation and judges whether the threshold voltage Vth of the memory cell MC is equal to or more than a verify voltage VLb or not. The verify voltage VLb is a positive voltage lower than the verify voltage VLa. The second write verify operation is performed after the first write verify operation and judges whether the threshold voltage Vth of the memory cell MC is equal to or more than the verify voltage VLa or not. The write voltage application operation and the first and second write verify operations are repeatedly executed until it is judged by the second write verify operation that the threshold voltage of the memory cell MC is equal to or more than the verify voltage VLa.

Figure 4:
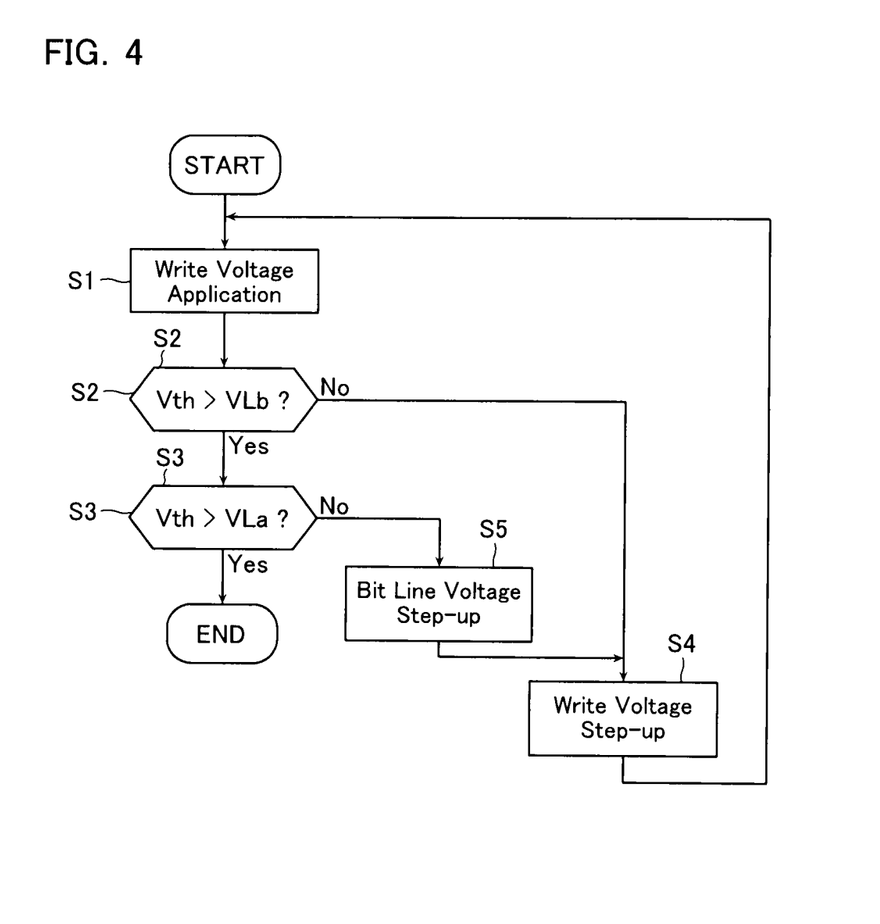
FIG. 4 is a flowchart showing a write operation according to a first embodiment.

Next, the write operation is described with reference to FIG. 4. First, a first write voltage Vpgm is applied via a selected word line WL to a control gate of a memory cell MC linked to the selected word line WL (S1). If the following first write verify operation (S2) and second write verify operation (S3) are both verify pass (Yes in S2 and Yes in S3), then the write operation to that memory cell MC is completed. In this case, setting a channel substantially to a power supply voltage via the bit line BL and setting the channel to a floating state causes the memory cell MC to be set to a write inhibit state. If the first write verify operation (S2) is pass and the second write verify operation (S3) is not pass (No in S3), then a voltage of the bit line BL is stepped up by an amount of Δbl (S5). In addition, the write voltage Vpgm is stepped up by an amount of Δpgm (S4), and the next write operation is shifted to (S1).

Figure 5:
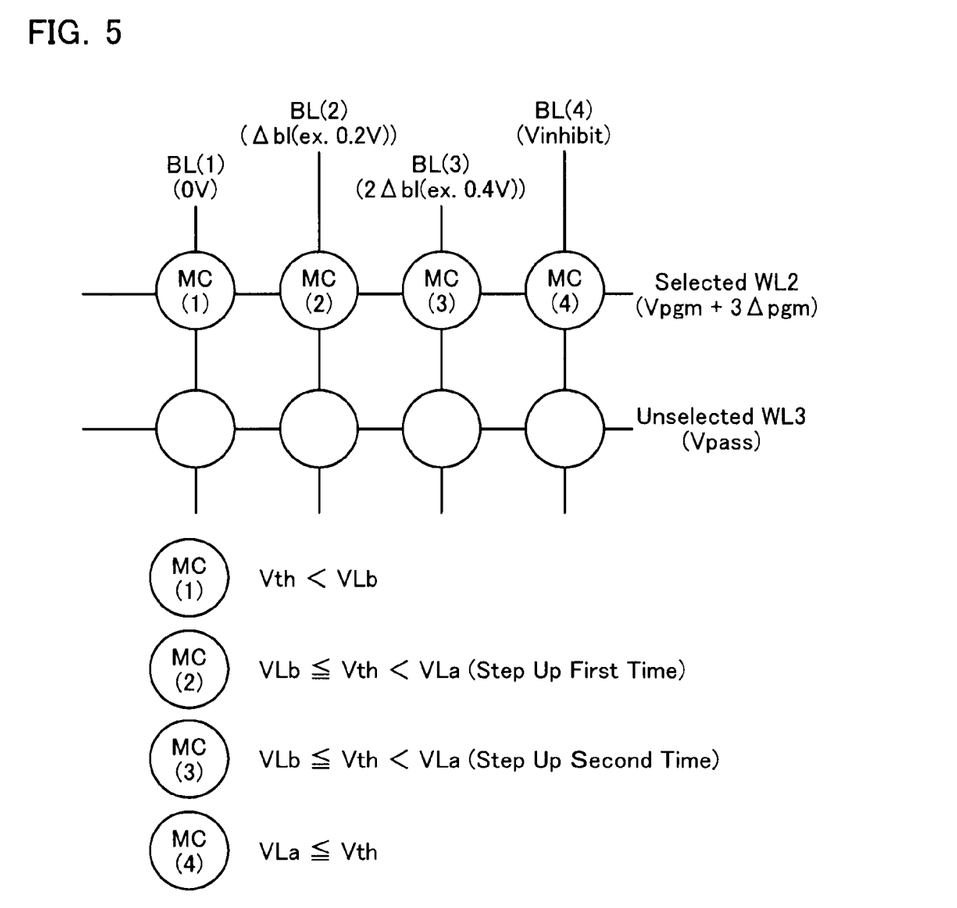
FIG. 5 is a view showing a relationship of voltages in various kinds of lines during the write operation.

Next, a relationship of voltages in various kinds of lines during the write operation is described with reference to FIG. 5. FIG. 5 shows one example of voltages applied to the word lines WL and bit lines BL linked to each of the memory cells MC in a mid-course stage of the write operation. In FIG. 5, the selected memory cells MC(1), MC(2) and MC(3) connected to the selected word line WL2 are subject to the write operation, and the memory cell MC(4) has write completed. Unselected memory cells MC connected to unselected word lines WL1 and WL3-16 are not subject to the write operation. The selected word line WL2 is applied with the write voltage Vpgm (for example, 20 V) +3Δpgm, and the unselected word lines WL1 and WL3-16 are applied with a pass voltage Vpass (for example, 8 V).

Figure 6A:
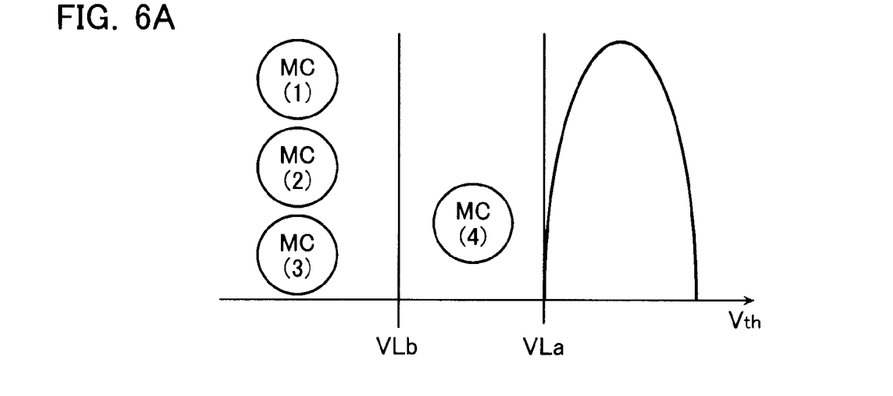
FIGS. 6A to 6C are views showing a change in threshold of memory cells MC(1)-MC(4) in each stage of the write operation until the relationship of voltages in FIG. 5 is reached.
Figure 6B:
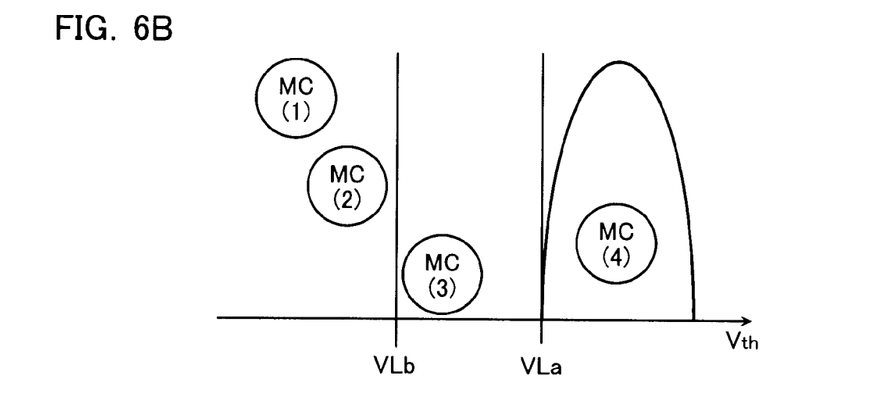
Figure 6C:
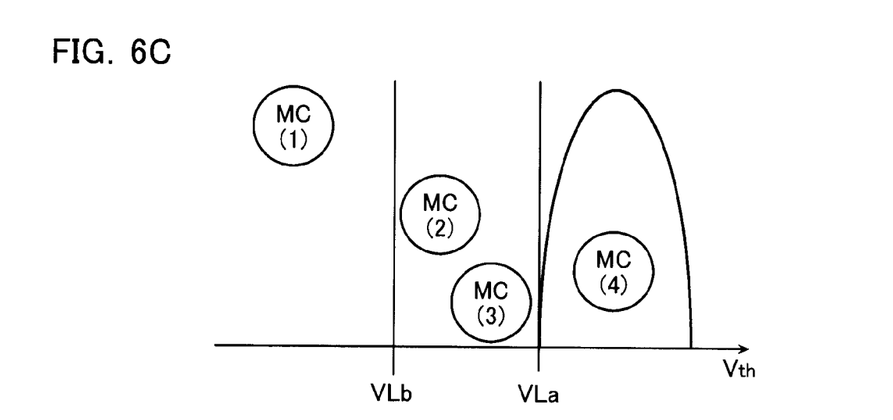

FIGS. 6A to 6C are views showing a change in threshold of memory cells MC(1)-MC(4) in each stage of the write operation until the relationship of voltages in FIG. 5 is reached.

First, in a first stage write operation, the write voltage Vpgm is applied to the selected word line WL2. As a result, as shown in for example FIG. 6A, variation in ease-of-writing of each of the memory cells MC leads to the memory cell MC(4) passing the first write verify operation, but the memory cells MC(1), MC(2) and MC(3) not passing the first write verify operation.

In a second stage write operation, a write voltage Vpgm+ Δpgm is applied to the selected word line WL2 in a state where a bit line voltage Δbl is applied to the bit line BL(4) linked to the memory cell MC(4). As a result, as shown in FIG. 6B, the memory cell MC(3) passes the first write verify operation and the memory cell MC(4) passes the second write verify operation. On the other hand, the memory cells MC(1) and MC(2) still do not pass the first write verify operation.

In this case, in a third stage write operation, the bit line voltage Δbl is applied to the bit line BL(3) linked to the memory cell MC(3), and, after setting the memory cell MC(4) to the write inhibit state, a write voltage Vpgm+ 2Δpgm is applied to the selected word line WL2. As a result, as shown in FIG. 6C, the memory cell MC(2) passes the first write verify operation.

In this case, in a fourth stage write operation, voltages of the bit lines BL(1)-(3) linked respectively to the memory cells MC(1), MC(2) and MC(3) become, respectively, 0, Δbl and 2Δbl. In addition, a write voltage Vpgm+3Δpgm is applied to the selected word line WL2. This state is the voltage state shown in FIG. 5.

As is clear from the above, the control shown in FIG. 5 results in a potential difference between floating gate and channel increasing in the order of unselected memory cell MC(4)<memory cell MC(3)<memory cell MC(2)<memory cell MC(1). As a result, the write voltage application operation is inhibited in the unwritten memory cell MC(4), and the write voltage application operation is executed such that a higher write voltage is applied to the hard-to-write memory cell MC(1) than to the easy-to-write memory cell MC(3).

Figure 7:
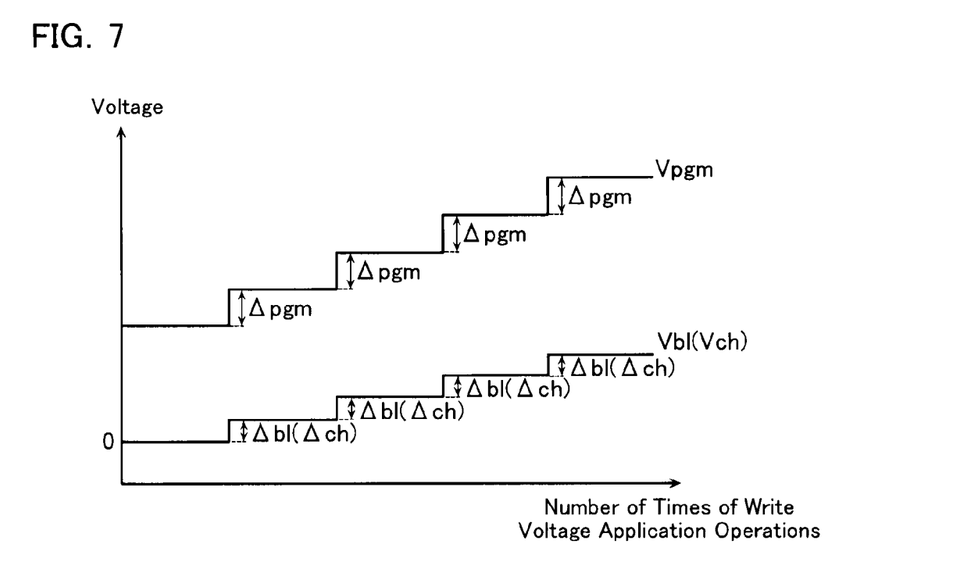
FIG. 7 is a view showing a write voltage Vpgm and a channel potential Vch of a memory cell MC according to the embodiment.

Next, the write voltage Vpgm applied to the selected word line WL2 and a channel potential Vch of the memory cell MC are described with reference to FIG. 7. As shown in FIG. 7, the write voltage Vpgm is stepped up $\Delta$pgm at a time in response to an increase in the number of times of executions of the write voltage application operation. However, a timing at which the stepping-up begins differs according to ease-of-writing of the memory cell MC, that is, according to a threshold change state after write in the memory cell MC.

Now, conventionally, the channel potential Vch of a memory cell MC subject to write is set constant regardless of increase in the number of times of executions of the write voltage application operation, or is raised one time only after passing the first write verify operation. Therefore, the potential difference between floating gate and channel in the memory cell MC is stepped up $\Delta$pgm at a time in response to an increase in the number of times of executions of the write voltage application operation. As a result, it sometimes occurs that the one time of the write voltage application operation causes the threshold voltage of the memory cell MC subject to write to shift too much in the positive direction, whereby an upper trail of the threshold voltage distribution of the memory cell MC spreads.

In contrast, in the present embodiment, as shown in FIG. 7, the voltage of the bit line BL is stepped up by a voltage $\Delta$bl at a time in response to the number of times of executions of the write voltage application operation and the threshold voltage of the memory cell MC. This causes a voltage to be transferred from the bit line BL to the channel of the memory cell MC whereby the channel potential Vch of the memory cell MC is stepped up by a voltage $\Delta$ch at a time. Therefore, the potential difference between floating gate and channel in the memory cell MC is stepped up by a voltage $\Delta$pgm−$\Delta$ch at a time in response to an increase in the number of times of executions of the write voltage application operation and the threshold. That is, the present embodiment can suppress an amount of increase in potential difference between floating gate and channel in the memory cell MC more than conventional technology. This allows the present embodiment to suppress spread of the upper trail of the threshold voltage distribution of the memory cell MC more than conventional technology.

Figure 8:
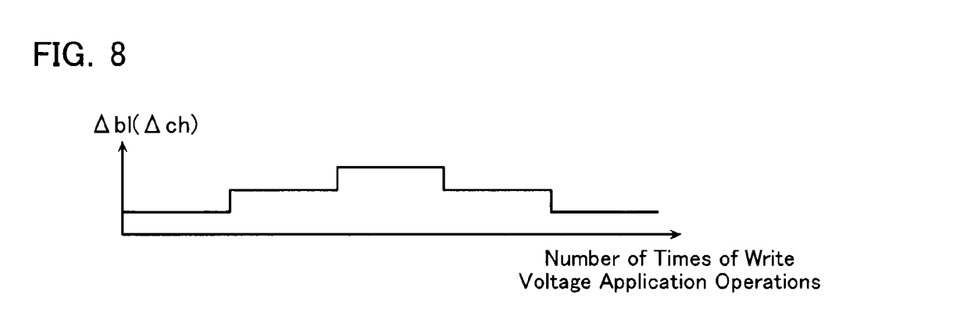
FIG. 8 is a view showing a voltage Δbl (Δch).

The above-mentioned voltage $\Delta$bl ($\Delta$ch) may be configured as a voltage smaller than $\Delta$pgm. This is because there may also be cases where it is more desirable to gradually increase a voltage between word line WL and channel when the number of times of write increases. Note that a step width $\Delta$bl ($\Delta$ch) of the voltage of the bit line BL need not have a constant spacing. Moreover, as shown in FIG. 8, the voltage $\Delta$bl ($\Delta$ch) may be configured to fall after rising in response to increase in the number of times of executions of the write voltage application operation.

Next, the fourth stage write voltage application operation shown in FIG. 5 is described with reference to FIG. 9. Over times t11-t15 in FIG. 9, a voltage of the source line SRC is set to 1.3 V, and a voltage of the source side select gate line SGS is set to 0 V. This causes the source side select transistor SSTr to be set to a non-conductive state over times t11-t15. In addition, a voltage of the bit line BL(1) is set to 0 V over times t11-t15.

Figure 9:
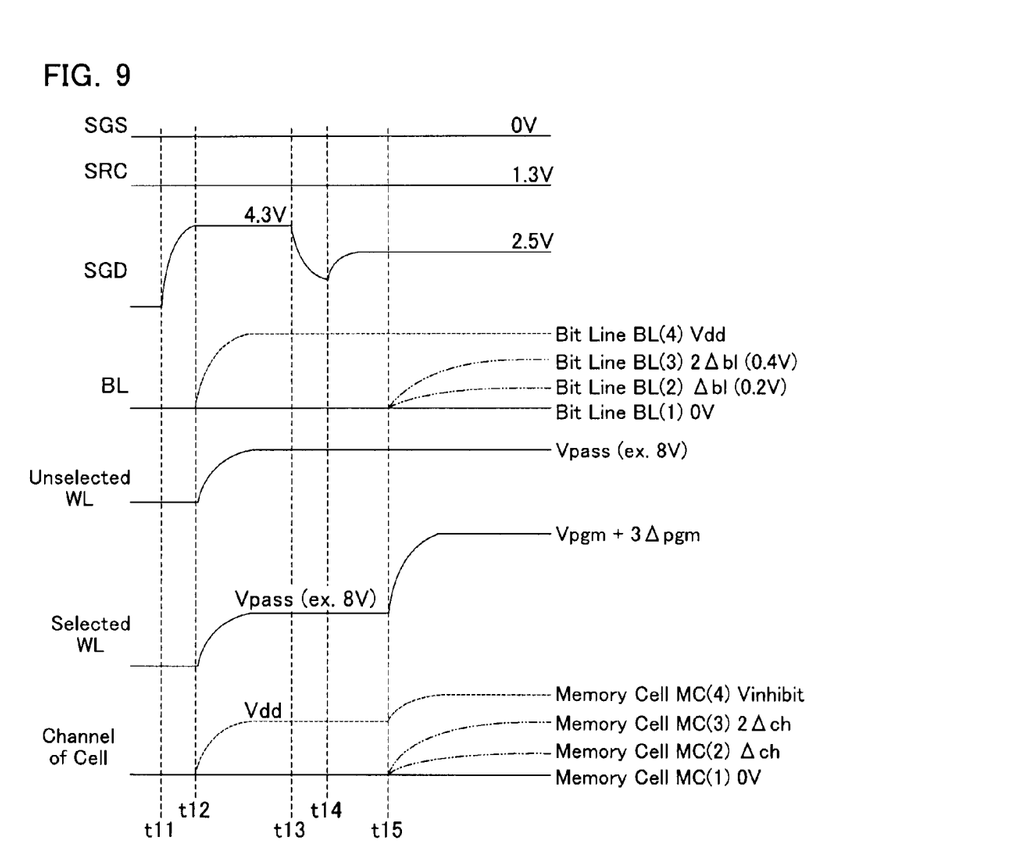
FIG. 9 is a timing chart showing a voltage in the various kinds of lines during a write voltage application operation according to the embodiment.

As shown in FIG. 9, first, at time t11, a voltage of the drain side select gate line SGD is raised to 4.3 V. Next, at time t12, a voltage of a non-write bit line BL(4) is raised to the power supply voltage Vdd. Additionally, at time t12, voltages of the unselected word lines WL and the selected word line WL are raised to the pass voltage Vpass. As a result, the voltage of the non-write bit line BL(4) is transferred, via the drain side select transistor SDTr rendered in a conductive state, to a channel of a non-write cell MC(4), whereby a channel potential of the memory cell MC(4) is charged to near the power supply voltage Vdd. This causes the drain side select transistor SDTr connected to the bit line BL(4) to be off.

Then, at time t13, the voltage of the drain side select gate line SGD is lowered and, at time t14, is set to about 2.5 V. As a result, a leak to the bit line BL(4) from the drain side select transistor SDTr corresponding to the bit line BL(4) is prevented.

Then, at time t15, the voltages of the bit lines BL(2) and BL(3) are raised to voltages $\Delta$bl (=0.2 V) and 2$\Delta$bl (=0.4 V), respectively. This causes the channel potentials corresponding to the bit lines BL(2) and BL(3) to rise to voltages $\Delta$ch and 2$\Delta$ch, respectively, according to respective degrees of write. On the other hand, the voltage of the bit line BL(1) is maintained at 0 V, hence channel potential of the memory cell MC(1) is maintained at 0 V.

Additionally, at time t15, the voltage of the selected word line WL is raised to the write voltage Vpgm+3$\Delta$pgm. As a result, the potential difference between floating gate and channel in the memory cell MC(1) becomes Vpgm+3$\Delta$pgm, and, moreover, the potential difference between floating gate and channel in the memory cell MC(2) becomes Vpgm+3$\Delta$pgm−$\Delta$ch, and the potential difference between floating gate and channel in the memory cell MC(3) becomes Vpgm+3$\Delta$pgm−2$\Delta$ch. In such a way, the threshold voltages of the memory cells MC(1), MC(2) and MC(3) are applied with different write voltages to be shifted in the positive direction.

Meanwhile, as previously mentioned, at time t12, the channel potential of the memory cell MC(4) is charged to the power supply voltage Vdd. Thus, even if the voltage of the drain side select gate line SGD is raised to 2.5 V at time t14, the drain side select transistor SDTr corresponding to the bit line BL(4) is maintained as is in a non-conductive state. Therefore, at time t14 and after, the channel of the memory cell MC(4) becomes floating. As a result, at time t15, when the write voltage Vpgm+3$\Delta$pgm is applied to the gate of the memory cell MC(4), the channel potential of the non-write memory cell MC rises due to coupling. Therefore, the potential difference between floating gate in the memory cell MC(4) does not become large, hence the threshold voltage of the memory cell MC(4) does not shift. Moreover, the voltage applied to the drain side select gate line SGD (2.5 V) is preferably set to a higher voltage than the channel voltage of the memory cell MC subject to write.

The channel of the above-described memory cell MC(4) is rendered floating and has its channel potential raised by an ordinary self-boost system or a local self-boost system. In the ordinary self-boost system, the channel of the memory cell MC(4) is rendered floating by electrically separating the channel of the memory string MS including the memory cell MC(4) from the bit line BL and the source line SRC. Moreover, the channel potential of the memory cell MC(4) is raised by coupling along with the channel potential of adjacent memory cells MC. On the other hand, in the local self-boost system, the channel of the memory cell MC(4) is electrically separated from the channels of adjacent memory cells MC, to be rendered floating. Moreover, the channel potential of the memory cell MC(4) is raised by coupling independently to the channel potential of adjacent memory cells MC. Selection of the ordinary self-boost system or the local self-boost system is made according to magnitude of the pass voltage Vpass and the write voltage Vpgm.

Figure 10:
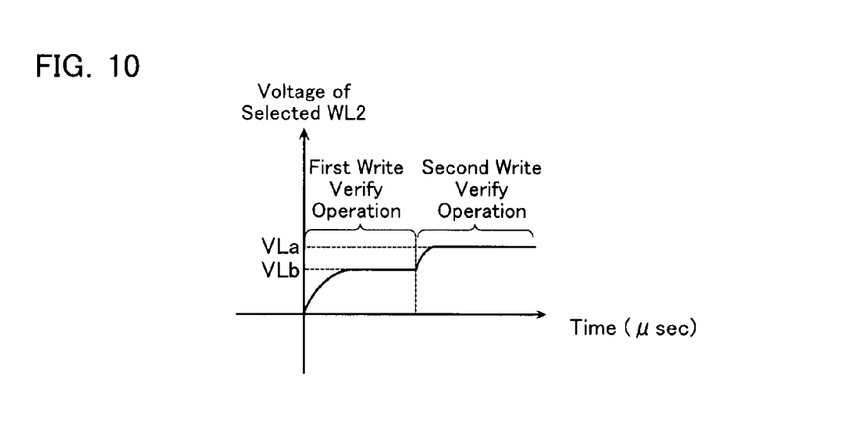
FIG. 10 is a timing chart showing a voltage of a selected word line WL2 in first and second write verify operations according to the embodiment.

Next, the first and second write verify operations are described with reference to FIG. 10. In the first and second write verify operations, the voltage of the bit line BL is set higher than the voltage of the source line SRC. The drain side select transistor SDTr and the source side select transistor SSTr are set to a conductive state. Unselected memory cells MC have their gates applied with a read voltage Vread to be set to a conductive state. Moreover, as shown in FIG. 10, the selected memory cell MC has its gate applied with the verify voltage VLb in the first write verify operation, and has its gate applied with the verify voltage VLa in the second write verify operation. In the first write verify operation as described above, the threshold voltage of the selected memory cell MC is judged to be equal to or more than the verify voltage VLb when there is no flow of a current of a certain value or more from the bit line BL to the source line SRC. Moreover, in the second write verify operation as described above, the threshold voltage of the selected memory cell MC is judged to be equal to or more than the verify voltage VLa when there is no flow of a current of a certain value or more from the bit line BL to the source line SRC.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 11:
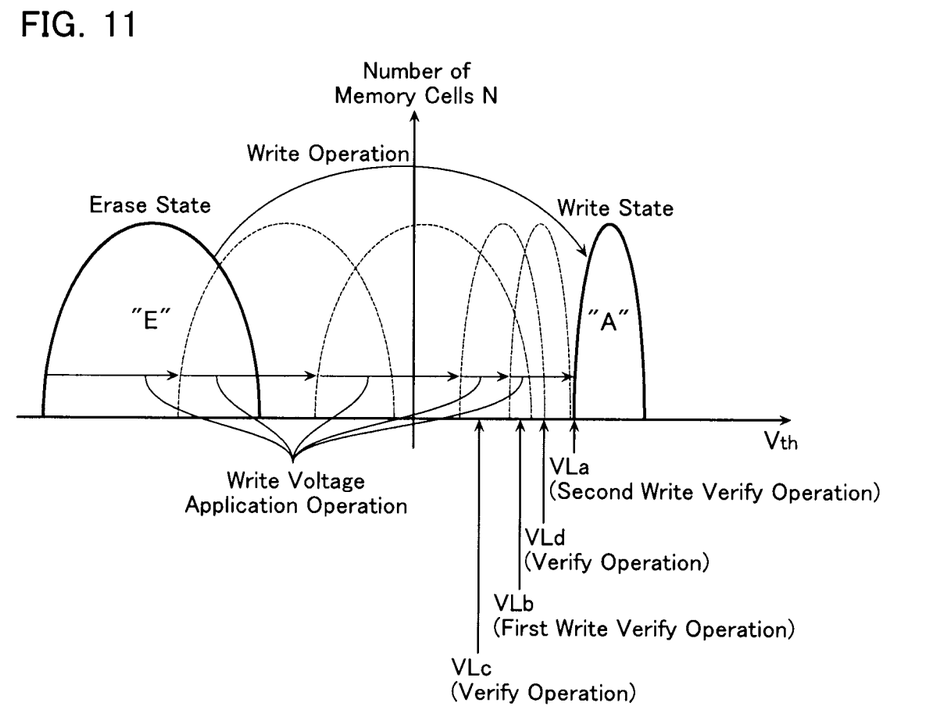
FIG. 11 is a view showing a write operation in a two-level storage flash memory according to another embodiment.

For example, as shown in FIG. 11, a verify operation using a verify voltage VLc lower than the verify voltage VLb may be further executed before the first write verify operation. Moreover, as shown in FIG. 11, a verify operation using a verify voltage VLd between the verify voltage VLa and the verify voltage VLb may be further executed after execution of the second write verify operation.

In the above-described example shown in FIG. 11, when a write voltage application operation is executed on a memory cell MC having a threshold voltage which is less than the verify voltage VLb and equal to or more than the verify voltage VLc, the voltage of the bit line BL electrically connected to one end of a current path of that memory cell MC may be stepped up Δcha at a time, accompanying an increase in the number of times of executions of the write voltage application operation. In addition, when a write voltage application operation is executed on a memory cell MC having a threshold voltage which is less than the verify voltage VLd and equal to or more than the verify voltage VLb, the voltage of the bit line BL electrically connected to one end of a current path of that memory cell MC may be stepped up Δchb at a time (Δchb<Δcha), accompanying an increase in the number of times of executions of the write voltage application operation. Moreover, when a write voltage application operation is executed on a memory cell MC having a threshold voltage which is less than the verify voltage VLa and equal to or more than the verify voltage VLd, the voltage of the bit line BL electrically connected to one end of a current path of that memory cell MC may be stepped up Δchc at a time (Δchc<Δchb), accompanying an increase in the number of times of executions of the write voltage application operation.

In addition, the above-mentioned embodiments described a nonvolatile semiconductor memory device having a two-level storage system (one bit per cell) or a four-level storage system. However, the present invention is of course not limited to these systems and may be applied also to an eight-level or more storage system, and so on.

What is claimed is:

1. A nonvolatile semiconductor memory device, comprising:
   a memory cell being electrically data rewritable;
   a bit line electrically connected to one end of a current path of the memory cell;
   a word line commonly connected to the memory cells arranged in a direction intersecting the bit line; and
   a control circuit configured to execute: a write voltage application operation for applying a write voltage to the word line so shift a threshold voltage of the memory cell to be data written that the threshold voltage of the memory cell to be data written reaches a first threshold voltage; a first verify operation for judging whether the threshold voltage of the memory cell to be data written is equal to or more than a second threshold voltage which is lower than the first threshold voltage or not; and a second verify operation for judging whether the threshold voltage of the memory cell to be data written is equal to or more than the first threshold voltage or not,
   during execution of the write voltage application operation on the memory cell judged by the first and second verify operations to have a threshold voltage which is less than the first threshold voltage and equal to or more than the second threshold voltage, accompanying an increase in number of times of executions of the write voltage application operation, the control circuit being configured to gradually raise a voltage of the word line and gradually change a voltage of the bit line corresponding to the memory cell.

2. A nonvolatile semiconductor memory device, comprising:
   a memory cell being electrically data rewritable;
   a bit line electrically connected to one end of a current path of the memory cell;
   a word line commonly connected to the memory cells arranged in a direction intersecting the bit line; and
   a control circuit configured to execute a write operation for applying a write voltage to the word line so shift a threshold voltage of the memory cell to be data written that the threshold voltage of the memory cell to be data written reaches a certain threshold voltage,
   during the write operation, while applying a gradually rising write voltage to the word line, the control circuit being configured to gradually change a voltage applied to the bit line based on a relationship between the threshold voltage of the memory cell to be written and a number of times of the write voltage applications.

3. The nonvolatile semiconductor memory device according to claim 2, wherein
   the control circuit executes: a write voltage application operation for applying a write voltage to the word line so shift a threshold voltage of the memory cell to be data written that the threshold voltage of the memory cell to be data written reaches a first threshold voltage; a first verify operation for judging whether the threshold voltage of the memory cell to be data written is equal to or more than a second threshold voltage which is lower than the first threshold voltage or not; and a second verify operation for judging whether the threshold voltage of the memory cell is equal to or more than the first threshold voltage or not, and, during execution of the write voltage application operation on the memory cell judged by the first and second verify operations to have a threshold voltage which is less than the first threshold voltage and equal to or more than the second threshold voltage, accompanying an increase in number of times of executions of the write voltage application operation, the control circuit being configured to gradually raises a voltage of the word line and gradually changes a voltage of the bit line corresponding to the memory cell.

4. The nonvolatile semiconductor memory device according to claim 2, wherein
the control circuit gradually steps up the write voltage applied to the word line and steps up the voltage of the bit line synchronously with the write voltage.

5. The nonvolatile semiconductor memory device according to claim 4, wherein
a step-up width of the voltage of the bit line is smaller than a step-up width of the write voltage.

6. The nonvolatile semiconductor memory device according to claim 4, wherein
a step-up width of the voltage of the bit line rises and then falls in response to an increase in a number of times of executions of the write voltage application operation.

7. The nonvolatile semiconductor memory device according to claim 3, further comprising:
a source line connected to the other end of the current path of the memory cell,
wherein
the control circuit, in the first verify operation and the second verify operation, sets the voltage of the bit line higher than a voltage of the source line,
the control circuit applies a first voltage to the word line in the first verify operation and applies a second voltage to the word line in the second verify operation, and
the second voltage is larger than the first voltage.

8. The nonvolatile semiconductor memory device according to claim 3, wherein
the control circuit, during application of the write voltage to the word line, sets to a floating state a channel of the memory cell for which the write voltage application operation is inhibited.

9. The nonvolatile semiconductor memory device according to claim 3, wherein
the control circuit executes the first verify operation multiple times while raising the second threshold voltage.

10. The nonvolatile semiconductor memory device according to claim 3, wherein
the control circuit gradually steps up the write voltage applied to the word line and steps up the voltage of the bit line synchronously with the write voltage, and
a step-up width of the voltage of the bit line differs in correspondence with a value of the second threshold voltage.

11. The nonvolatile semiconductor memory device according to claim 3, wherein
the memory cell is configured capable of storing multilevel data.

12. A method of data write in a nonvolatile semiconductor memory device, the nonvolatile semiconductor memory device including a memory cell being electrically data rewritable, a bit line electrically connected to one end of a current path of the memory cell, and a word line commonly connected to the memory cells arranged in a direction intersecting the bit line, the method of data write comprising:

executing a write operation for applying a write voltage to the word line so shift a threshold voltage of the memory cell to be data written that the threshold voltage of the memory cell to be data written reaches a certain threshold voltage, and, during the write operation, while applying a gradually rising write voltage to the word line, gradually changing a voltage applied to the bit line based on a relationship between the threshold voltage of the memory cell to be written and a number of times of the write voltage applications.

13. The method of data write in a nonvolatile semiconductor memory device according to claim 12, further comprising:
executing a write voltage application operation for applying a write voltage to the word line so shift a threshold voltage of the memory cell to be data written that the threshold voltage of the memory cell to be data written reaches a first threshold voltage;
executing a first verify operation for judging whether the threshold voltage of the memory cell to be data written is equal to or more than a second threshold voltage which is lower than the first threshold voltage or not; and
executing a second verify operation for judging whether the threshold voltage of the memory cell is equal to or more than the first threshold voltage or not; and
during execution of the write voltage application operation on the memory cell judged by the first and second verify operations to have a threshold voltage which is less than the first threshold voltage and equal to or more than the second threshold voltage, and accompanying an increase in number of times of executions of the write voltage application operation, gradually raising a voltage of the word line and gradually changing a voltage of the bit line corresponding to the memory cell.

14. The method of data write in a nonvolatile semiconductor memory device according to claim 12, further comprising:
gradually stepping up the write voltage applied to the word line and stepping up the voltage of the bit line synchronously with the write voltage.

15. The method of data write in a nonvolatile semiconductor memory device according to claim 14, wherein
a step-up width of the voltage of the bit line is smaller than a step-up width of the write voltage.

16. The method of data write in a nonvolatile semiconductor memory device according to claim 14, wherein
a step-up width of the voltage of the bit line rises and then falls in response to an increase in a number of times of executions of the write voltage application operation.

17. The method of data write in a nonvolatile semiconductor memory device according to claim 12, wherein the nonvolatile semiconductor memory device further comprises a source line connected to the other end of the current path of the memory cell, the method of data write further comprising:
in the first verify operation and the second verify operation, setting the voltage of the bit line higher than a voltage of the source line; and
applying a first voltage to the word line in the first verify operation and applying a second voltage to the word line in the second verify operation, wherein
the second voltage is larger than the first voltage.

18. The method of data write in a nonvolatile semiconductor memory device according to claim 12, further comprising:
during application of the write voltage to the word line, setting to a floating state a channel of the memory cell for which the write voltage application operation is inhibited.

19. The method of data write in a nonvolatile semiconductor memory device according to claim 12, further comprising:
executing the first verify operation multiple times while raising the second threshold voltage.

20. The method of data write in a nonvolatile semiconductor memory device according to claim 12, further comprising:
gradually stepping up the write voltage applied to the word line and stepping up the voltage of the bit line synchronously with the write voltage, wherein
a step-up width of the voltage of the bit line differs in correspondence with a value of the second threshold voltage.

* * * * *